United States Patent
Hsu et al.

(10) Patent No.: US 7,948,084 B2
(45) Date of Patent: May 24, 2011

(54) DIELECTRIC MATERIAL WITH A REDUCED DIELECTRIC CONSTANT AND METHODS OF MANUFACTURING THE SAME

(75) Inventors: Louis Lu-Chen Hsu, Fishkill, NY (US); Jack Allan Mandelman, Flat Rock, NC (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 11/928,913

(22) Filed: Oct. 30, 2007

(65) Prior Publication Data

US 2008/0054487 A1  Mar. 6, 2008

Related U.S. Application Data

(62) Division of application No. 11/360,350, filed on Feb. 23, 2006, now Pat. No. 7,732,322.

(51) Int. Cl.
*H01L 23/48* (2006.01)
(52) U.S. Cl. .......................................... 257/758; 438/619
(58) Field of Classification Search .................. 438/619, 438/238–256, 381–399; 257/758
See application file for complete search history.

(56) References Cited

U.S. PATENT DOCUMENTS

| | | | |
|---|---|---|---|
| 6,090,698 A * | 7/2000 | Lee | 438/619 |
| 6,204,192 B1 | 3/2001 | Zhao et al. | |
| 6,610,593 B2 | 8/2003 | Kohl et al. | |
| 6,835,631 B1 | 12/2004 | Zhen et al. | |
| 6,861,332 B2 | 3/2005 | Park et al. | |
| 6,903,002 B1 | 6/2005 | Ben-Tzur et al. | |
| 2003/0109122 A1 | 6/2003 | Gross | |
| 2004/0115910 A1 | 6/2004 | Passemard et al. | |
| 2006/0030128 A1 | 2/2006 | Bu et al. | |
| 2007/0173073 A1 | 7/2007 | Weber | |

FOREIGN PATENT DOCUMENTS

WO   WO 02/058134   7/2002

* cited by examiner

*Primary Examiner* — Thanh V Pham
*Assistant Examiner* — Tony Tran
(74) *Attorney, Agent, or Firm* — Dugan & Dugan, PC (57) ABSTRACT

In a first aspect, a first method of manufacturing a dielectric material with a reduced dielectric constant is provided. The first method includes the steps of (1) forming a dielectric material layer including a trench on a substrate; and (2) forming a cladding region in the dielectric material layer by forming a plurality of air gaps in the dielectric material layer along at least one of a sidewall and a bottom of the trench so as to reduce an effective dielectric constant of the dielectric material. Numerous other aspects are provided.

20 Claims, 10 Drawing Sheets

DIELECTRIC MATERIAL WITH A REDUCED DIELECTRIC CONSTANT AND METHODS OF MANUFACTURING THE SAME

The present application is a division of and claims priority to U.S. application Ser. No. 11/360,350, filed Feb. 23, 2006 now U.S. Pat. No. 7,732,322, which is hereby incorporated by reference herein in its entirety.

FIELD OF THE INVENTION

The present invention relates generally to semiconductor device manufacturing, and more particularly to a dielectric material with a reduced effective dielectric constant and methods of manufacturing the same.

BACKGROUND

A porous low dielectric constant (k) or "low k" dielectric may be used to reduce a capacitance of an interconnect. However, conventional porous low k dielectric materials may fail mechanically due to back end of line (BEOL) processes such as chemical mechanical polishing (CMP). To prevent such mechanical failures, a mechanically-stronger dielectric material may be employed. However, mechanically-stronger dielectric materials typically have a higher k, which may result in an undesired increase in capacitance. Accordingly, dielectric material with a reduced dielectric constant and methods of manufacturing the same are desired.

SUMMARY OF THE INVENTION

In a first aspect of the invention, a first method of manufacturing a dielectric material with a reduced dielectric constant is provided. The first method includes the steps of (1) forming a dielectric material layer including a trench on a substrate; and (2) forming a cladding region in the dielectric material layer by forming a plurality of air gaps in the dielectric material layer along at least one of a sidewall and a bottom of the trench so as to reduce an effective dielectric constant of the dielectric material.

In a second aspect of the invention, a first apparatus is provided. The first apparatus is a semiconductor device component that includes (1) a dielectric material layer including a trench on a substrate; and (2) a cladding region in the dielectric material layer, the cladding region including a plurality of air gaps in the dielectric material layer along at least one of a sidewall and a bottom of the trench so as to reduce an effective dielectric constant of the dielectric material.

In a third aspect of the invention, a first system is provided. The first system is a substrate that includes an semiconductor device component having (1) a dielectric material layer including a trench on a substrate; and (2) a cladding region in the dielectric material layer, the cladding region includes a plurality of air gaps in the dielectric material layer along at least one of a sidewall and a bottom of the trench so as to reduce an effective dielectric constant of the dielectric material. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides a dielectric material with a reduced dielectric constant (k) and methods of manufacturing the same. Such a dielectric material may be employed while forming semiconductor device components. For example, in some embodiments, the present invention provides and includes interconnect structures and methods of manufacturing the same. Specifically, the present invention provides an interconnect structure having a cladding region formed on one or more sides of an interconnect included therein. The cladding region may be included in the dielectric material region formed on one or more sides of the interconnect. The cladding region may include the dielectric material and gaps of air, process gases and/or the like. Consequently, an effective k of the cladding region may be lower than a k of the dielectric material in the remaining portions of the dielectric material region, thereby reducing an effective k of the dielectric material. Further, a mechanical strength of the cladding region may be greater than the mechanical strength of a dielectric material with a similar k. Consequently, CMP may be employed to form such interconnect. In this manner, the present invention provides and includes improved interconnect structures and methods of manufacturing the same.

Figure 1:
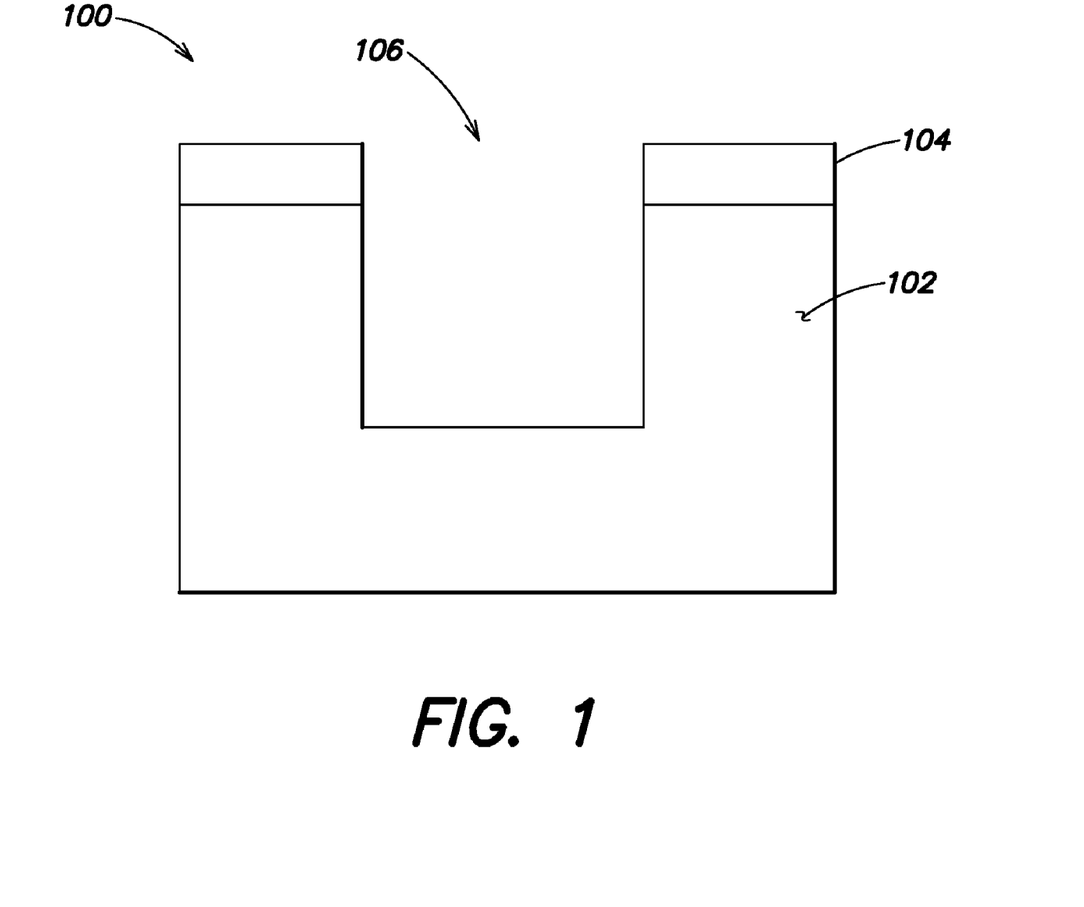
FIG. 1 illustrates a cross-sectional side view of a substrate following a first step of a method of manufacturing a dielectric material with a reduced dielectric constant (k) in accordance with an embodiment of the present invention.

FIG. 1 illustrates a cross-sectional side view of a substrate 100 following a first step of a method of manufacturing a dielectric material with a reduced dielectric constant (k) in accordance with an embodiment of the present invention. With reference to FIG. 1, a substrate 100 may be provided. Chemical vapor deposition (CVD), spin-on, or another suitable method may be employed to form a dielectric (e.g., silicon oxide doped with carbon and/or hydrogen elements (SiO(C,H)) and/or the like) material layer 102 on the substrate 100. The dielectric material layer 102 may have a k of about 2.9 (although a layer of another suitable material with a different k may be employed). CVD, spin-on, or another suitable method may be employed to deposit a hard mask layer (e.g., silicon nitride ($Si_3N_4$), silicon dioxide ($SiO_2$) and/or the like) 104 on a top surface of the dielectric material layer 102. Reactive ion etching (RIE) or another suitable method may be employed to remove portions of the dielectric material layer 102 and hard mask layer 104 so as to form an interconnect trough 106. The interconnect trough 106 may serve as a region in which conductive material (e.g., copper, aluminum, tungsten and/or the like) may be formed. In this manner, the dielectric material layer 102 may be patterned and etched to form a metal line pattern. The interconnect trough 106 may have dimensions with a width of about 500 to about 1500 angstroms (Å) and a depth of about 500 to about 5000 Å (although a larger or smaller and/or different width and/or depth may be employed).

Figure 2:
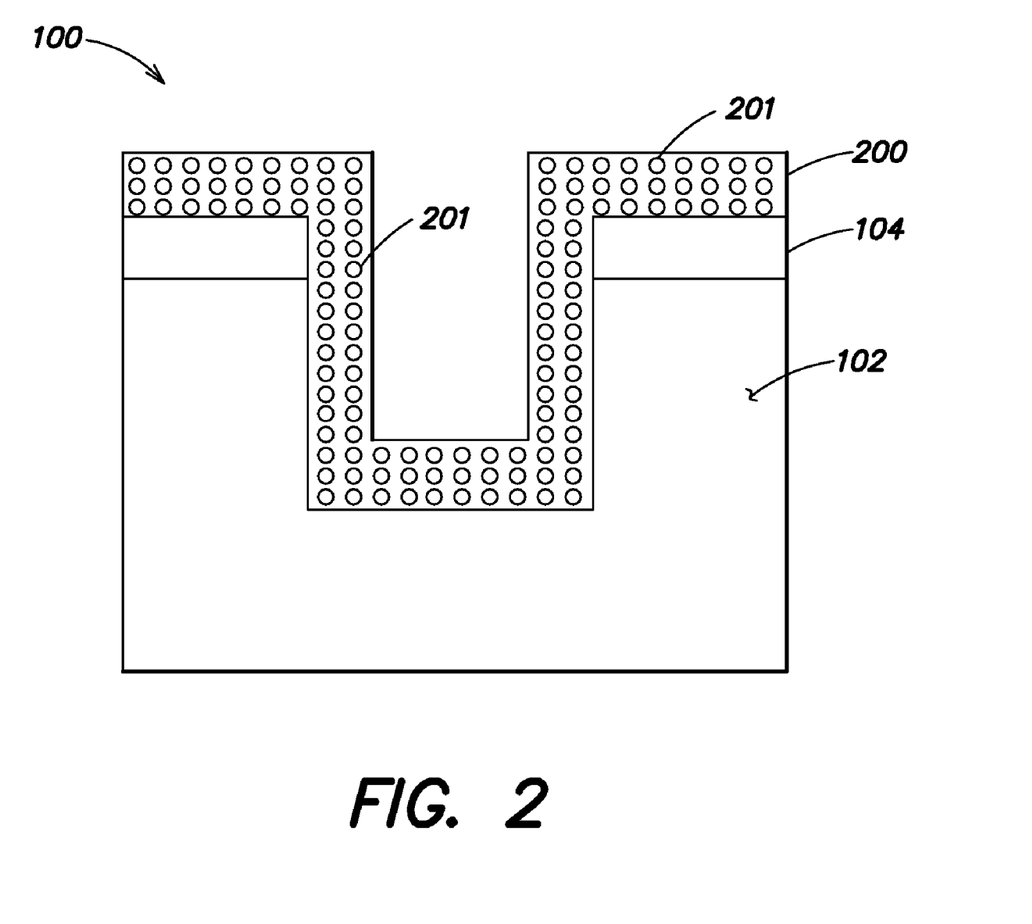
FIG. 2 illustrates a cross-sectional side view of the substrate following a second step of the method of manufacturing a dielectric material with a reduced k in accordance with an embodiment of the present invention.

FIG. 2 illustrates a cross-sectional side view of the substrate 100 following a second step of the method of manufacturing a dielectric material with a reduced k in accordance with an embodiment of the present invention. With reference to FIG. 2, CVD, spin-on, or another suitable method may be employed to form (e.g., conformably) a sacrificial layer of P+ doped silicon material (e.g., amorphous, polycrystalline and/or the like) on the patterned layers 102, 104 of the substrate 100. The sacrificial layer of P+ doped silicon material may have a thickness of about 3 nm to about 100 nm (although a larger or smaller and/or different thickness range may be employed). Thereafter, anodization employing an anodization current or another suitable method may be employed to convert (e.g., chemically) the P+ doped silicon material layer into a porous silicon layer 200 having pores 201. For example, the substrate 100 may be placed in an electrically-biased hydrofluoric (HF) or similar solution. The porosity of the porous silicon layer 200 may vary based on the density of the P+ dopant, the anodization current and/or the like. The porosity may range from about 10% to about 50% (although a larger or smaller and/or different porosity may be employed). As described below, the porous silicon layer 200 may be employed to form air gaps in portions of the dielectric material layer 102.

Figure 3:
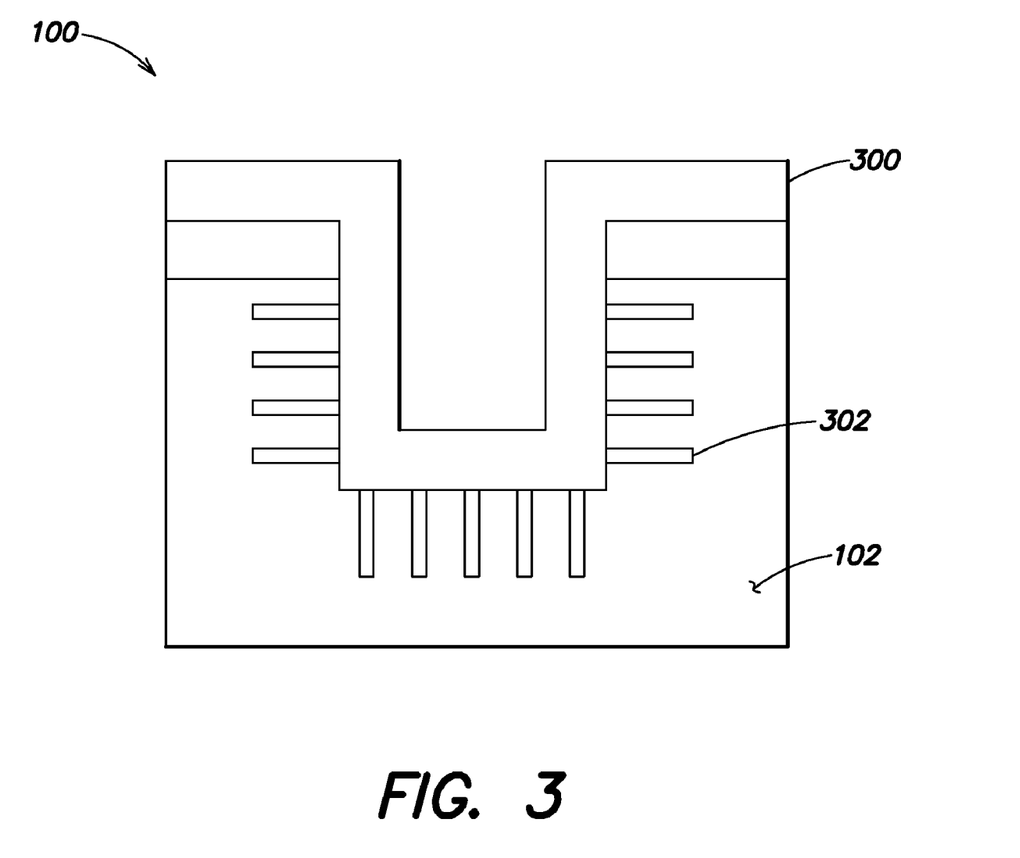
FIG. 3 illustrates a cross-sectional side view of the substrate following a third step of the method of manufacturing a dielectric material with a reduced k in accordance with an embodiment of the present invention.

FIG. 3 illustrates a cross-sectional side view of the substrate 100 following a third step of the method of manufacturing a dielectric material with a reduced k in accordance with an embodiment of the present invention. With reference to FIG. 3, oxidation or another suitable method may be employed to convert the porous silicon layer 200 into an oxide (e.g., $SiO_2$) layer 300. Such reaction may be represented by the following formula: $Si+O_2 \rightarrow SiO_2$. For example, the substrate 100 may be exposed to a high-pressure unbiased oxygen (e.g., $O_2$ and/or the like) plasma treatment or another suitable process. During oxidation, oxygen may diffuse through pores (201 in FIG. 2) in the porous silicon layer 200 so as to form protrusions 302 of an oxide (e.g., $SiO_2$) material in the dielectric material layer 102 behind the oxidizing porous layer. Such reaction may be represented by the formula: $SiO(C,H)+O_2 \rightarrow SiO_2$. The protrusions 302 may be about 5 Å in diameter and about 200 Å in length (although a larger or smaller diameter and/or length may be employed). The oxide layer 300 created by the high-pressure unbiased O2 plasma anisotropically penetrates normal to sidewalls of the dielectric material layer 102.

Figure 4:
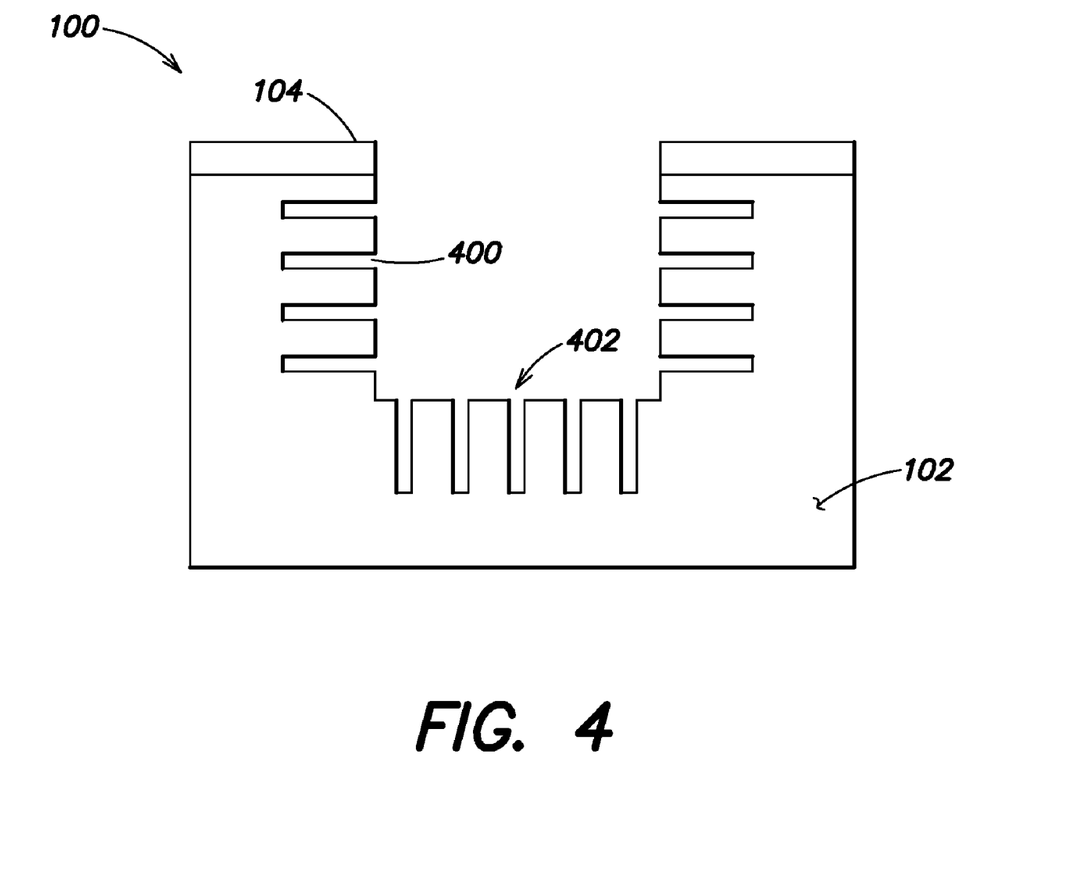
FIG. 4 illustrates a cross-sectional side view of the substrate following a fourth step of the method of manufacturing a dielectric material with a reduced k in accordance with an embodiment of the present invention.

FIG. 4 illustrates a cross-sectional side view of the substrate 100 following a fourth step of the method of manufacturing a dielectric material with a reduced k in accordance with an embodiment of the present invention. With reference to FIG. 4, a dilute HF wet etch (e.g., with a very high selectivity to SiO(C,H)) or another suitable method may be employed to remove all or substantially all of the oxide layer 300 and the protrusions 302 so as to form air gaps 400 in the dielectric material layer 102. The dilute HF wet etch may be equivalent to removing an SiO(C,H) damage layer in a conventional BEOL process. The air gaps 400 may be 5 Å in diameter and about 200 Å in length (although a larger or smaller diameter and/or length may be employed). In this manner, a cladding region 402 that includes the air gaps 400 may be formed in the dielectric material layer 102. The cladding region 402 will be adjacent or proximate an interconnect (e.g., metal wiring) subsequently formed in the interconnect trough 106. The air gaps 400 may have a k of about 1.0 (although larger or smaller k may be employed). Consequently, the cladding region 402 may have an effective k that is less than the k of the dielectric material. For example, the cladding region 402 may have an effective k of less than about 2.0, and remaining portions of the dielectric material layer 102 may have a k of about 2.9 (although the cladding region 402 and/or the dielectric material may have a larger or smaller k). Further, the cladding region 402 and remaining portions of the dielectric material layer 102 may be mechanically-strong. For example, CMP or other such BEOL processes may be employed on the substrate 100 without damaging the cladding region 402 and remaining portions of the dielectric material layer 102.

Figure 5:
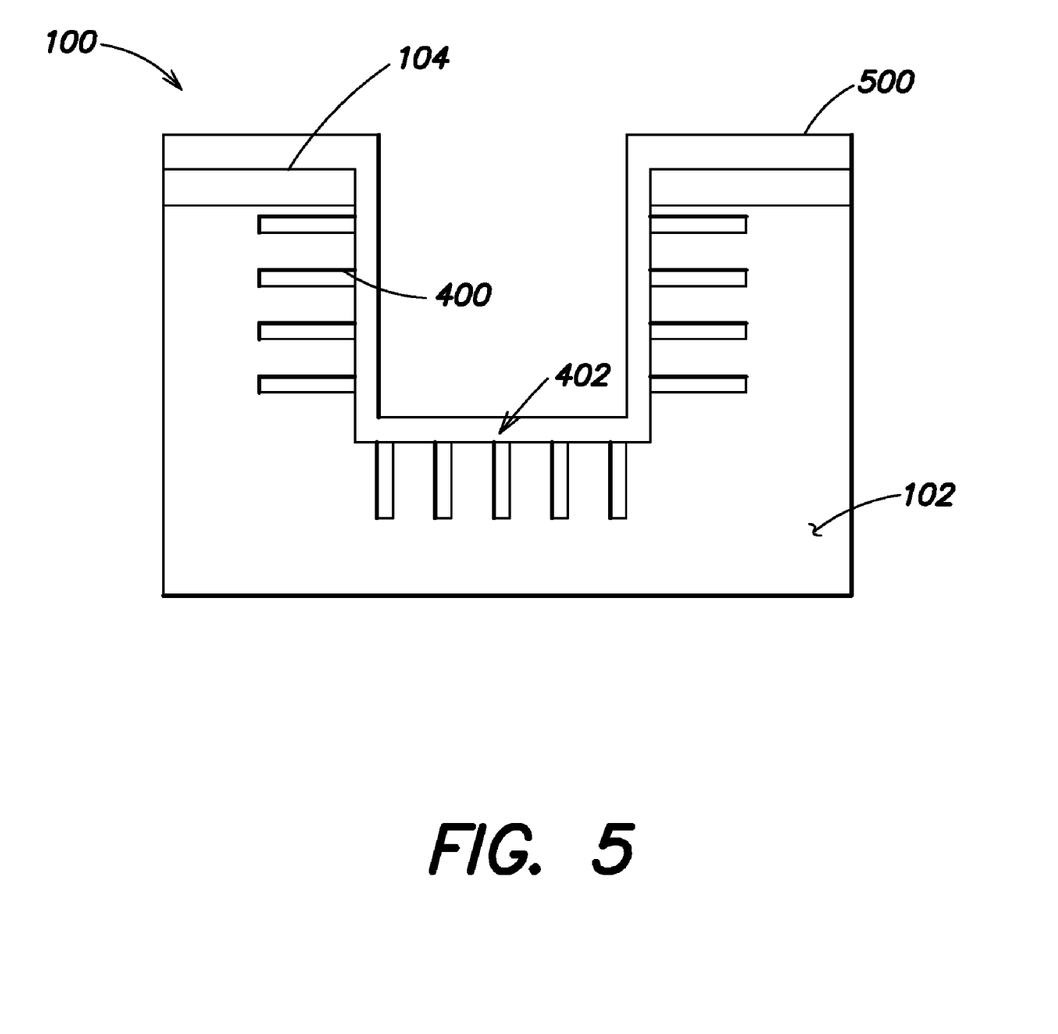
FIG. 5 illustrates a cross-sectional side view of the substrate following a fifth step of the method of manufacturing a dielectric material with a reduced k in accordance with an embodiment of the present invention.

FIG. 5 illustrates a cross-sectional side view of the substrate 100 following a fifth step of the method of manufacturing a dielectric material with a reduced k in accordance with an embodiment of the present invention. With reference to FIG. 5, physical vapor deposition (PVD) or another suitable method may be employed to form a diffusion barrier (e.g., tantalum nitride (TaN), titanium nitride (TiN), ruthenium (Ru) and/or the like) layer 500 on the top surface of the dielectric material layer 102. The thickness of the diffusion barrier layer 500 may be about 2 to about 80 nm (although a larger or smaller and/or different thickness may be employed). The diffusion barrier layer 500 may cover openings 502 of the air gaps 400 on at least one surface of the interconnect trough 106. The diffusion barrier layer 500 may be employed to prevent material (e.g., copper (Cu) and/or the like) from diffusing into the dielectric material layer 102 and/or entering the voids 400 via the openings 502, thereby sealing a surface of the dielectric material layer 102.

Figure 6:
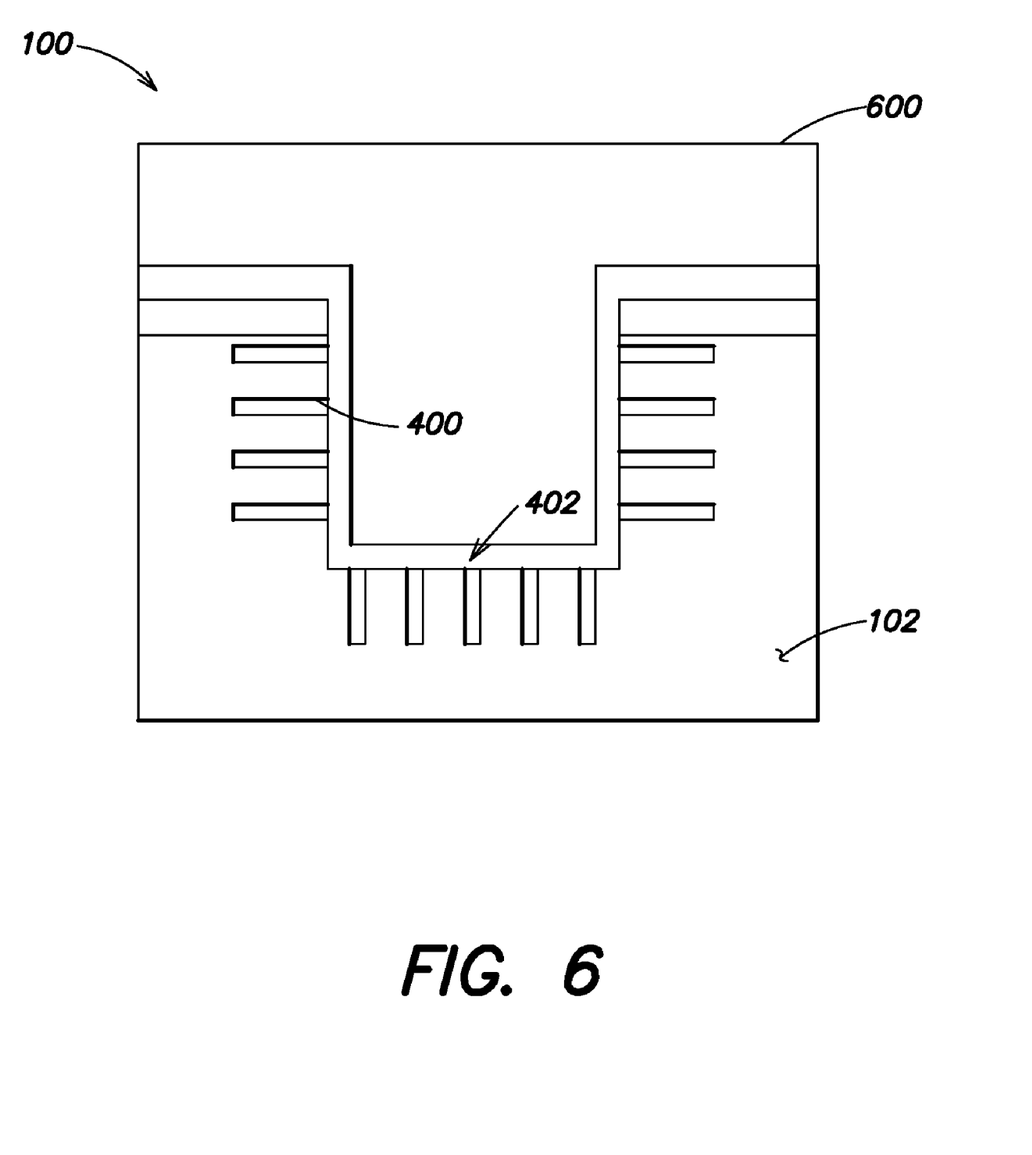
FIG. 6 illustrates a cross-sectional side view of the substrate following a sixth step of the method of manufacturing a dielectric material with a reduced k in accordance with an embodiment of the present invention.

FIG. 6 illustrates a cross-sectional side view of the substrate 100 following a sixth step of the method of manufacturing a dielectric material with a reduced k in accordance with an embodiment of the present invention. With reference to FIG. 6, as part of metal damascene processing CVD, electroplating or another suitable method may be employed to form a metal (Cu, aluminum (Al), Cu with Al impurities Cu(Al), tungsten (W) and/or the like) interconnect layer 600 on a top surface of the substrate 100. In this manner, the metal interconnect layer 600 may fill the interconnect trough (106 in FIG. 5). The thickness of the metal interconnect layer 600 on a top surface of the barrier layer 500 may be about 400 to about 1000 nm (although a larger or smaller and/or different thickness may be employed).

Figure 7:
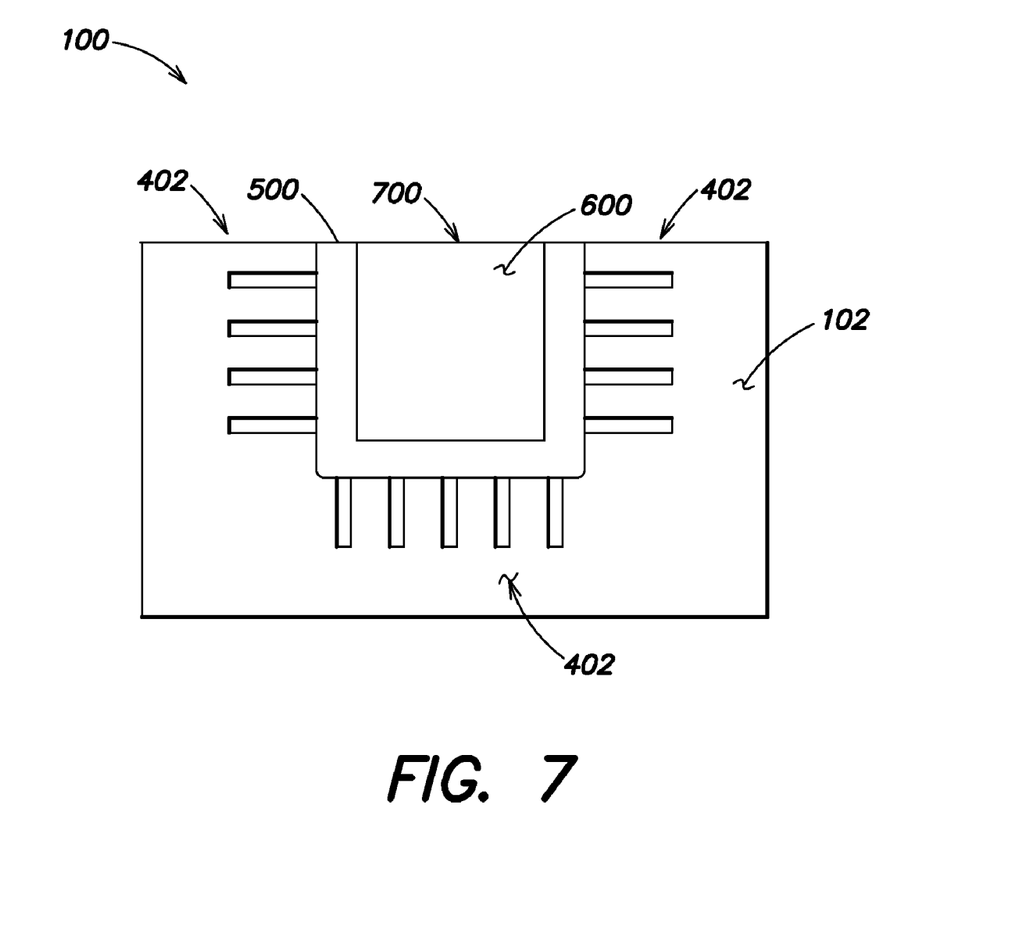
FIG. 7 illustrates a cross-sectional side view of the substrate following a seventh step of the method of manufacturing a dielectric material with a reduced k in accordance with an embodiment of the present invention.

FIG. 7 illustrates a cross-sectional side view of the substrate 100 following a seventh step of the method of manufacturing a dielectric material with a reduced k in accordance with an embodiment of the present invention. With reference to FIG. 7, CMP or another suitable method may be employed to remove hard mask layer 104 and portions of the metal interconnect layer 600 and the barrier deposition layer 500 so as to form a metal interconnect 700. A top surface of the metal interconnect 700 may be planar with a top surface of the dielectric material layer 102. During CMP, a force may be applied to a top surface of the substrate 100 which may induce mechanical stresses in the dielectric material layer 102 and/or the cladding region 402. The dielectric material layer 102 and the cladding region 402 may be mechanically-strong enough to withstand the mechanical stresses without failure.

The cladding region 402 adjacent the metal interconnect 700 may reduce the capacitance (e.g., parasitic capacitance) of the metal interconnect 700. The capacitance of the metal interconnect 700 may be based on the effective k of the cladding region 402. As discussed above, the cladding region 402 may have a k that is less than the k of remaining portions of the dielectric material layer 102. Consequently, then effective capacitance of the entire dielectric material layer 102 may be reduced by the cladding region 402.

Figure 8:
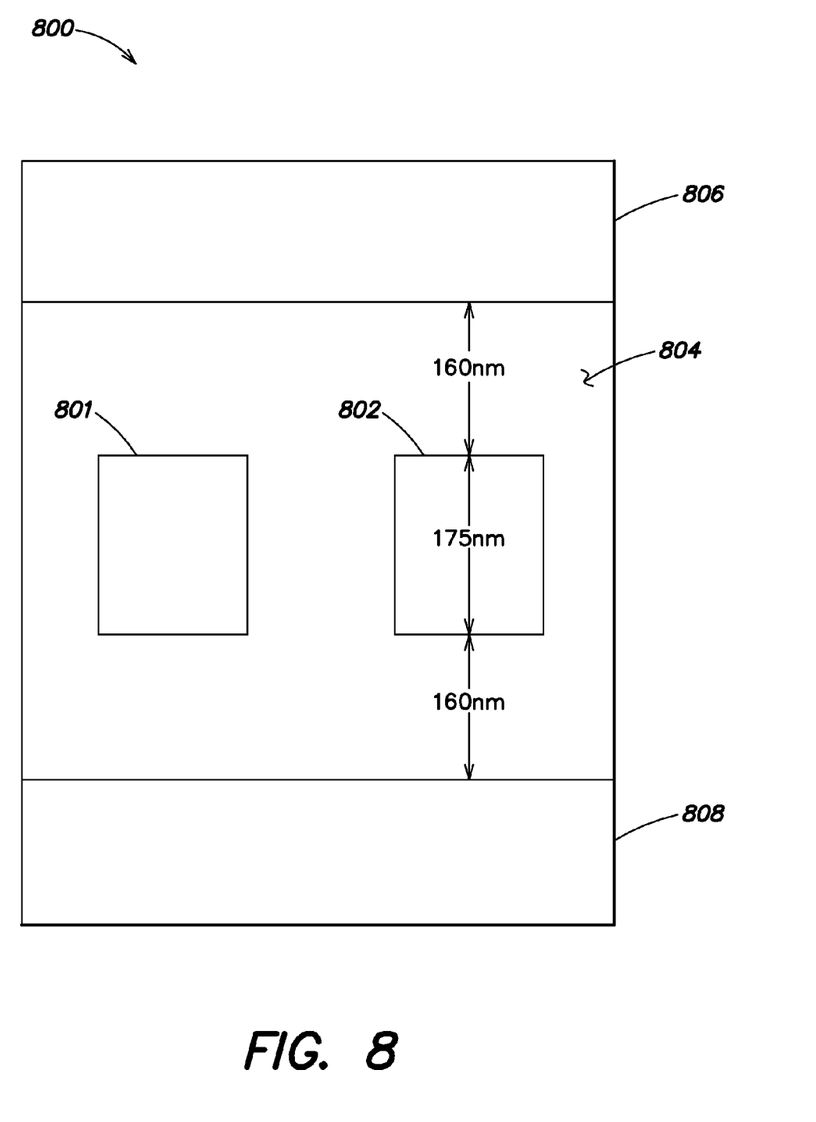
FIG. 8 illustrates a cross-sectional side view of a simulation model of an interconnect structure that may be formed.

FIG. 8 illustrates a cross-sectional side view of a simulation model of an interconnect structure that may be formed. With reference to FIG. 8, a simulation tool or environment (e.g., finite-element capacitance estimator (Foxi/Fierce) and the like) may be employed to simulate a model of an interconnect structure 800. The simulation model of the interconnect structure 800 may be employed to accurately predict BEOL and front end of line (FEOL) capacitances of the simulated model of the interconnect structure 800 over a range of semiconductor technologies.

A first metal line 801 and a second metal line 802 (e.g., in an M3 wiring level) may be disposed in a dielectric (e.g., SiCOH and/or the like) layer 804. The dielectric layer 804 may be disposed between a first metal layer 806 (e.g., an M4 wiring layer) and a second metal layer 808 (e.g., an M2 wiring layer). The dielectric layer 804 may have a k of about 3.2.

A distance between a top surface of the first metal line 801 and a bottom surface of the first metal layer 806 may be about 160 nm. A distance between a bottom surface of the first metal line 801 and a top surface of the second metal layer 808 may be about 160 nm. A distance between a right side surface of the first metal line 801 and a left side surface of the second metal line 802 may be about 100 nm. The respective widths of the first metal line 801 and the second metal line 802 may be about 100 nm. The respective heights of the first metal line 801 and the second metal line 802 may be about 175 nm. It should be noted that the first and second metal lines 801-802 are not adjacent a cladding region 402 of dielectric material that includes air gaps as described above.

The dielectric layer 804 may serve as an electrical insulator and/or the like during electrical simulations by the simulation tool or environment. More specifically, the dielectric layer 804 may serve as an electrical insulator between the first metal line 801, the second metal line 802, the first metal layer 806 and/or the second metal layer 808. The first metal line 801, the second metal line 802, the first metal layer 806 and second metal layer 808 may serve as conductors and/or the like during a simulation by the simulation tool or environment.

Furthermore, the simulation tool or environment may calculate a line-to-line capacitance ($C_{l-l}$) of the first metal line 801. Such $C_{l-l}$ may be a capacitance of the first metal line 801 with respect to the second metal line 802 or another adjacent line in the same level. The calculated result of the line-to-line capacitance of the first metal line 801 may be 68.6 aF/µm. The simulation tool or environment may also calculate a total capacitance ($C_{tot}$) of the first metal line 801. Such $C_{tot}$ may be the capacitance of the first metal line 801 with respect to neighboring lines (e.g., the second metal line 802, lines in the first metal layer 806 and the second metal layer 808). The calculated total capacitance of the metal line 801 may be 181.9 aF/µm.

Figure 9:
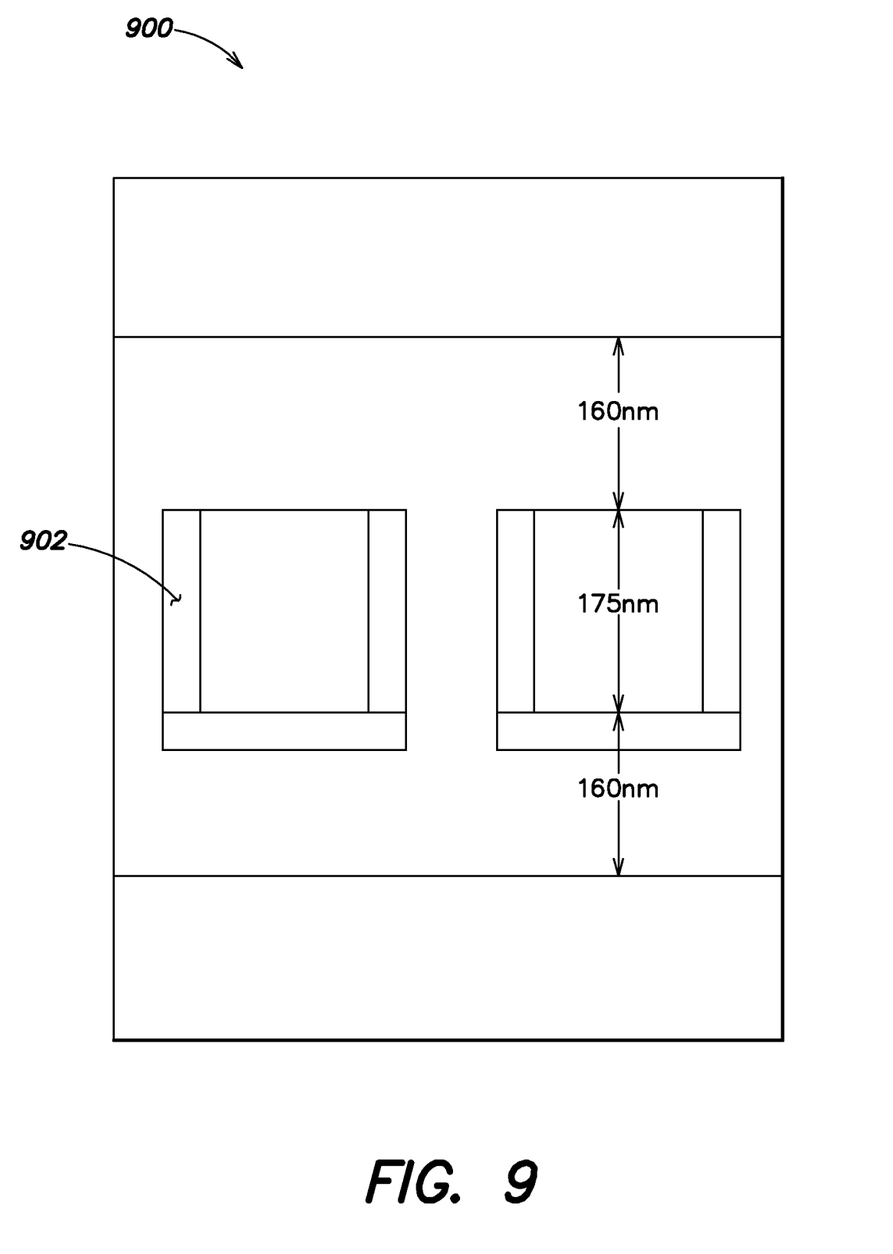
FIG. 9 illustrates a cross-sectional side view of a simulation model of an interconnect structure with a cladding region that may be formed in accordance with an embodiment of the present invention.

FIG. 9 illustrates a cross-sectional side view of a simulation model of an interconnect structure 900 with a cladding region that may be formed in accordance with an embodiment of the present invention. With reference to FIG. 9, the interconnect structure 900 may be similar to the interconnect structure 800. However, in contrast, the interconnect structure 900 may include a cladding region (e.g., voided SiCOH and/or the like) 902 disposed on at least one side of the first metal line 801 and/or the second metal line 802. As depicted, the cladding region 902 may be disposed on a plurality (e.g., three) sides of the first metal line 801 and a plurality (e.g., three) sides of the second metal line 802. The cladding region 902 may have an effective k of 1.5. This represents slightly more than 50% of the volume of the converted SiO(C,H) being occupied by voids. The dimensions of the cladding region 900 may be varied during simulation.

Figure 10:
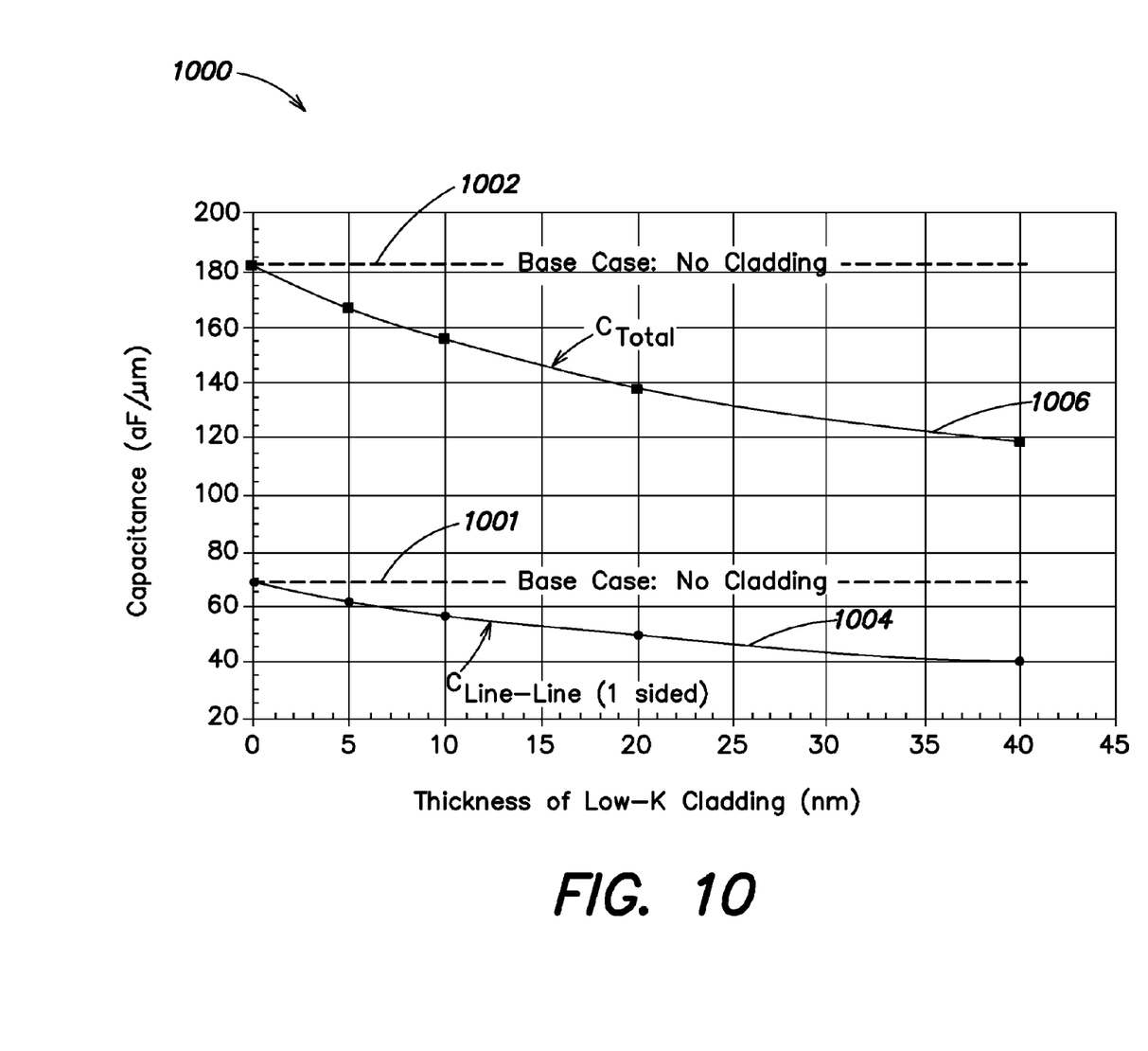
FIG. 10 illustrates a graph of results from a simulation of the simulation model of an interconnect structure that may be formed in accordance with an embodiment of the present invention.

FIG. 10 illustrates a graph 1000 of results from a simulation of the simulation model of an interconnect structure 900 that may be formed in accordance with an embodiment of the present invention. With reference to FIG. 10, a plot of the $C_{tot}$ and the $C_{l-l}$ of the first metal line 801 with respect to the thickness of the cladding region 902 is depicted. A base case $C_{l-l}$ dashed line 1001, a base case $C_{tot}$ dashed line 1002, a $C_{l-l}$ curved line 1004, and a $C_{tot}$ curved line 1006 are depicted. The base case $C_{l-l}$ dashed line 1001, and the base case $C_{tot}$ dashed line 1002 may represent the capacitances, $C_{l-l}$ and $C_{tot}$, of the first metal line 801 in the interconnect structure 800. The $C_{l-l}$ curved line 1004 and the $C_{tot}$ curved line 1006 may depict the capacitances, $C_{l-l}$ and $C_{tot}$, of the first metal line 801 with a cladding region 902 with respect to the thickness of the cladding region 902. From the data depicted in the graph 1000, an inverse relationship between the $C_{l-l}$ curved line 1004 and the thickness of the cladding region 902 and between the $C_{tot}$ curved line 1006 and the thickness of the cladding region 902 may be observed. Specifically, the graph 1000 illustrates as the thickness of the cladding region 902 increases, there may be a decrease in the capacitances, $C_{l-l}$ and $C_{tot}$, of the metal line 800. For example, for a cladding layer thickness of 20 nm, the interconnect structure 900 provides a reduction of nearly 25% in total M3 wiring capacitance (e.g., $C_{tot}$) compared to the interconnect structure 800.

In this manner, the present invention may preserve the mechanical strength of a dielectric material which includes a high-porosity structure (e.g., the cladding region 402) of the dielectric material in a volume adjacent a conductor (e.g., metal wire). Such structure may reduce a capacitance on the conductor.

The foregoing description discloses only exemplary embodiments of the invention. Modifications of the above disclosed apparatus and method which fall within the scope of the invention will be readily apparent to those of ordinary skill in the art. For instance, although in embodiments above the dielectric material layer 102 includes SiO(C,H), in other embodiments the dielectric material layer 102 may include additional and/or different materials. Although the dielectric material with a reduced dielectric constant (k) described above is employed for BEOL applications such as forming an interconnect structure, such a dielectric material may be employed to form a different semiconductor device component.

Accordingly, while the present invention has been disclosed in connection with exemplary embodiments thereof, it should be understood that other embodiments may fall within the spirit and scope of the invention, as defined by the following claims.

The invention claimed is:

1. A semiconductor device component, comprising:
   a dielectric material layer including a trench on a substrate;
   a porous silicon layer upon the dielectric material layer, wherein the porous silicon layer allows oxygen to diffuse through pores of the porous silicon layer such that oxide protrusions into the dielectric material layer are created when the porous silicon layer is oxidized;
   oxide protrusions extending into the dielectric layer from the porous silicon layer; and
   a cladding region in the dielectric material layer,
   wherein the oxide protrusions and the porous silicon layer are capable of being etched away, thereby forming in the cladding region, a plurality of air gaps in the dielectric material layer along at least one of a sidewall of the trench and a bottom of the trench so as to reduce an effective dielectric constant of the dielectric material.

2. The semiconductor device component of claim 1 wherein the trench is adapted to include an interconnect formed in the trench.

3. The semiconductor device component of claim 1 wherein the oxide protrusions are approximately perpendicular to the at least one of the sidewall and the bottom of the trench.

4. The semiconductor device component of claim 1 wherein the cladding region is adapted to:
   reduce an effective dielectric constant (k) of material adjacent an interconnect; and
   maintain a strength of the dielectric material layer.

5. The semiconductor device component of claim 1 wherein the dielectric material layer is adapted to withstand chemical mechanical polishing.

6. The semiconductor device component of claim 1 wherein dielectric material of the dielectric material layer includes silicon oxide doped with at least carbon and hydrogen elements.

7. The semiconductor device component of claim 1 wherein dielectric material of the dielectric material layer has a k of about 2.9 and the effective k of the cladding region is less than about 2.0.

8. The semiconductor device component of claim 1 wherein each air gap is about less than or equal to about 5 Å in diameter and about 200 Å in length.

9. The semiconductor device component of claim 1 further comprising a diffusion barrier layer between the cladding region and the trench.

10. A substrate, comprising:
    a semiconductor device component having:
    a dielectric material layer including a trench on a substrate;
    a porous silicon layer upon the dielectric material layer, wherein the porous silicon layer allows oxygen to diffuse through pores of the porous silicon layer such that oxide protrusions into the dielectric material layer are created when the porous silicon layer is oxidized;
    oxide protrusions extending into the dielectric layer from the porous silicon layer; and
    a cladding region in the dielectric material layer, wherein the oxide protrusions and the porous silicon layer are capable of being etched away, thereby forming in the cladding region, a plurality of air gaps in the dielectric material layer along at least one of a sidewall of the trench and a bottom of the trench so as to reduce an effective dielectric constant of the dielectric material.

11. The substrate of claim 10 wherein the trench is adapted to include an interconnect formed in the trench.

12. The substrate of claim 10 wherein the interconnect structure further comprises a diffusion barrier layer between the cladding region and the trench.

13. A semiconductor device component, comprising:
    a dielectric material layer including a trench on a substrate; and
    a cladding region in the dielectric material layer, the cladding region including a plurality of air gaps in the dielectric material layer along a bottom of the trench so as to reduce an effective dielectric constant of the dielectric material.

14. The semiconductor device component of claim 13, further wherein the cladding region includes a plurality of air gaps in the dielectric material layer along a sidewall of the trench so as to reduce the effective dielectric constant of the dielectric material.

15. The semiconductor device component of claim 13 wherein the air gaps are approximately perpendicular to the at least one of a sidewall and a bottom of the trench.

16. The semiconductor device component of claim 13 wherein the cladding region is adapted to:
    reduce an effective dielectric constant (k) of material adjacent an interconnect; and
    maintain a strength of the dielectric material layer.

17. The semiconductor device component of claim 13 wherein dielectric material of the dielectric material layer includes silicon oxide doped with at least carbon and hydrogen elements.

18. The semiconductor device component of claim 13 wherein dielectric material of the dielectric material layer has a k of about 2.9 and the effective k of the cladding region is less than about 2.0.

19. The semiconductor device component of claim 13 wherein each air gap is about less than or equal to about 5 Å in diameter and about 200 Å in length.

20. The semiconductor device component of claim 13 further comprising a diffusion barrier layer between the cladding region and the trench.

* * * * *